United States Patent
Liang et al.

(10) Patent No.: US 8,239,815 B2
(45) Date of Patent: Aug. 7, 2012

(54) SYSTEM AND METHOD FOR INSPECTING LAYOUT OF A PRINTED CIRCUIT BOARD

(75) Inventors: Hsien-Chuan Liang, Taipei Hsien (TW); Shen-Chun Li, Taipei Hsien (TW); Chun-Jen Chen, Taipei Hsien (TW); Shou-Kuo Hsu, Taipei Hsien (TW); Duen-Yi Ho, Taipei Hsien (TW); Yung-Chieh Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 249 days.

(21) Appl. No.: 12/701,677

(22) Filed: Feb. 8, 2010

(65) Prior Publication Data

US 2011/0047524 A1    Feb. 24, 2011

(30) Foreign Application Priority Data

Aug. 20, 2009   (CN) .......................... 2009 1 0305836

(51) Int. Cl.
*G06F 17/50* (2006.01)
(52) U.S. Cl. ........................................ 716/136; 716/137
(58) Field of Classification Search .................. 716/136, 716/137
See application file for complete search history.

(56) References Cited

U.S. PATENT DOCUMENTS 7,257,525 B2 * 8/2007 McGaughy ...................... 703/14
7,721,232 B2 * 5/2010 Ejury ............................ 716/132

* cited by examiner

*Primary Examiner* — Jack Chiang
*Assistant Examiner* — Brandon Bowers
(74) *Attorney, Agent, or Firm* — Altis Law Group, Inc.

(57) ABSTRACT

A system and method for inspecting layout of a printed circuit board (PCB) provides a graphical user interface (GUI). The GUI displays a layout of the PCB. High side pins of a pulse width modulation (PWM) controller and a component connected to a high side pin are found. If the component is a metallic oxide semiconductor field effect transistor (MOSFET), the system calculate absolute a linear distance and a trace distance between a source pin of the MOSFET and a capacitor pin of a coupling capacitor connected to the source pin. If the linear distance, the trace distance and a capacitance of the coupling capacitor accord with a layout standard, the layout of the PCB is determined to be up to standard.

9 Claims, 6 Drawing Sheets

SYSTEM AND METHOD FOR INSPECTING LAYOUT OF A PRINTED CIRCUIT BOARD

BACKGROUND

1. Technical Field

Embodiments of the present disclosure relates to printed circuit board (PCB) inspecting, and more particularly to a system and method for inspecting the layout of the PCB.

2. Description of Related Art

PCBs provide a mechanism to implement a circuit design (i.e., the interconnection of electrical devices and components) for use, for example, in a computer system. In designing a PCB, placement of metallic oxide semiconductor field effect transistor (MOSFET) on the PCB is very important. Capacitances of coupling capacitors connected to the MOSFET and distances between the MOSFET and the coupling capacitors may influence restraint of noise coupling. Thus, inspection of the layout is complex. At present, the inspection needs a user to input parameters manually. It may consume much time.

What is needed, therefore, is an improved system and method for inspecting layout of a printed circuit board.

DETAILED DESCRIPTION

All of the processes described below may be embodied in, and fully automated via, functional modules executed by one or more general purpose processors. The functional modules may be stored in any type of computer-readable medium or other computer storage device. Some or all of the methods may alternatively be embodied in specialized computer hardware or communication apparatus.

Figure 1:
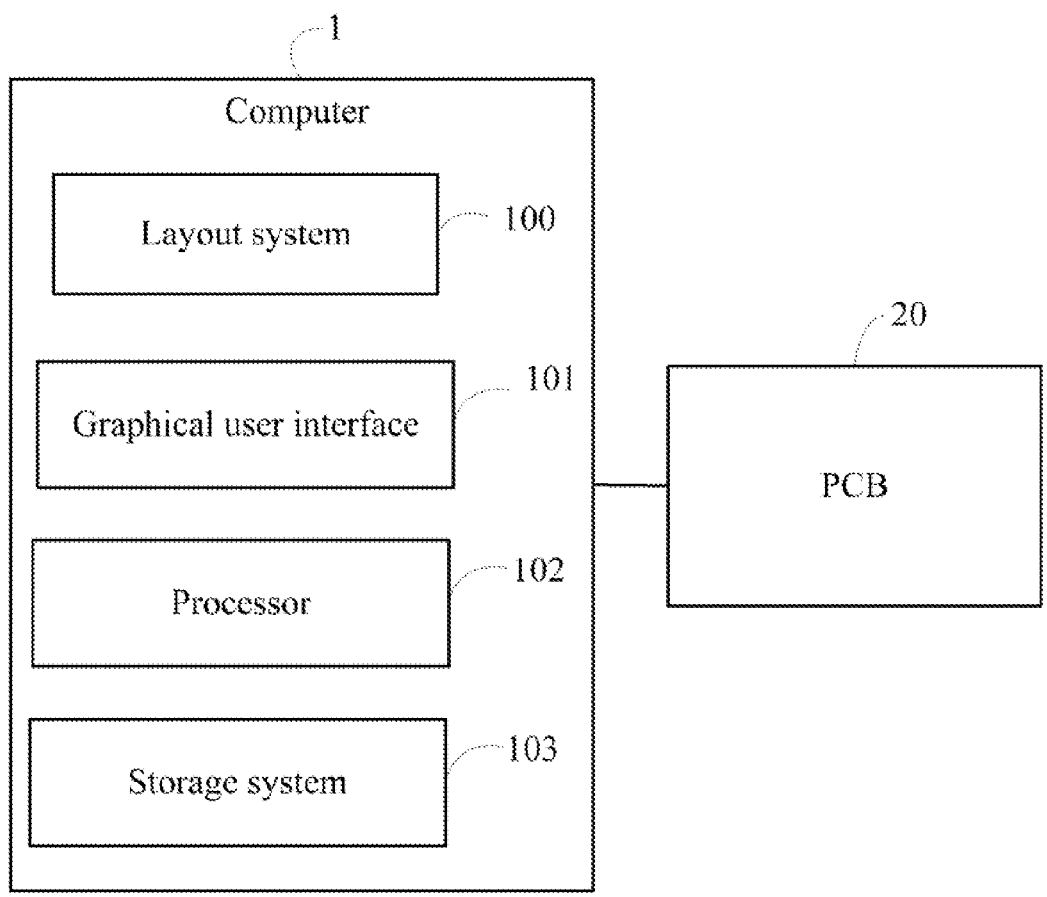
FIG. 1 is a block diagram of one embodiment of a computer comprising a layout system.
Figure 2:
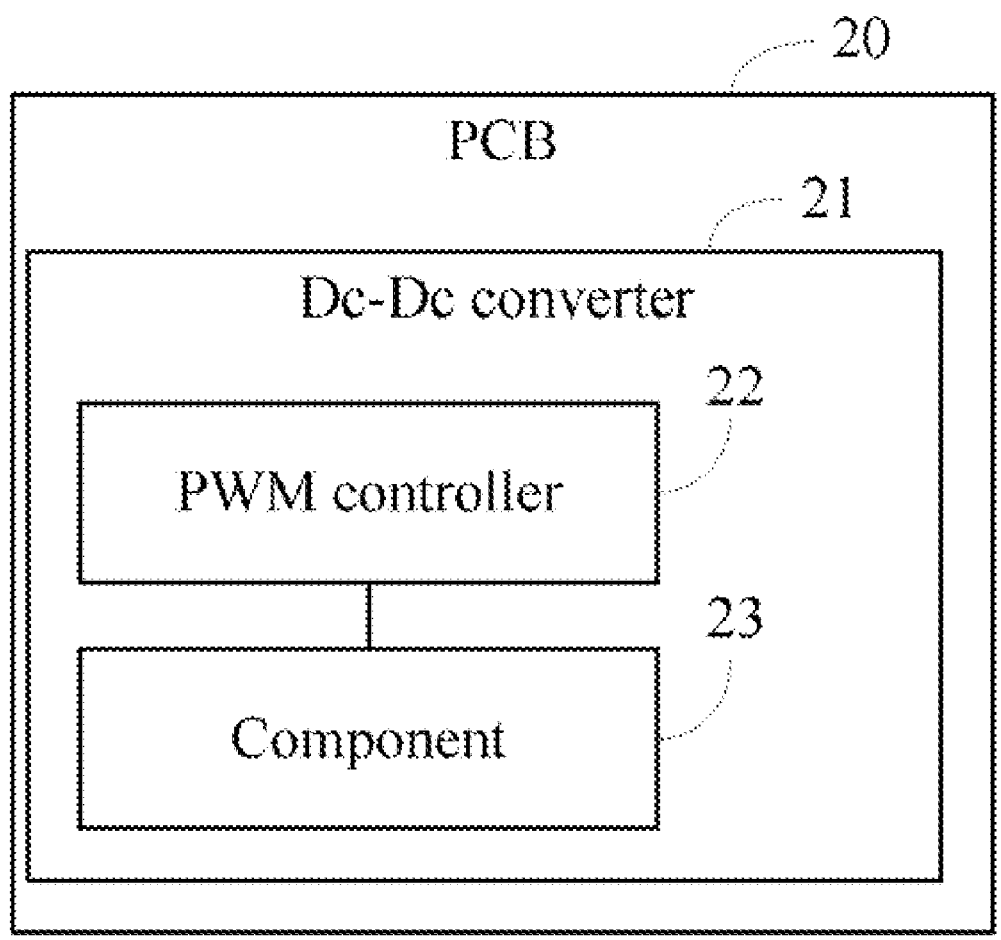
FIG. 2 is a schematic diagram illustrating one embodiment of a printed circuit board (PCB).

FIG. 1 is a block diagram of one embodiment of a computer 1 comprising a layout system 100. The layout system 100 may inspect layout of a printed circuit board (PCB) 20 connected to the computer 1. The computer 1 provides a graphical user interface (GUI) 101 to display the layout of the PCB 20. The PCB 20 includes a plurality of direct current-to-direct current (DC-DC) converters 103. The plurality of DC-DC converters 21 includes a pulse width modulation (PWM) controller 22 and a plurality of components 23 (only one shown in FIG. 2). The PWM controller 22 includes a plurality of pins.

In one embodiment, the pins may be, but are not limited to, high side pins and/or low side pins. In one embodiment, the components 23 may be any combination of coupling capacitors, resistors, and metallic oxide semiconductor field effect transistors (MOSFETs), for example. The MOSFET may include a source. The source is the power supply side of the MOSFET. The source includes a source pin.

Figure 6:
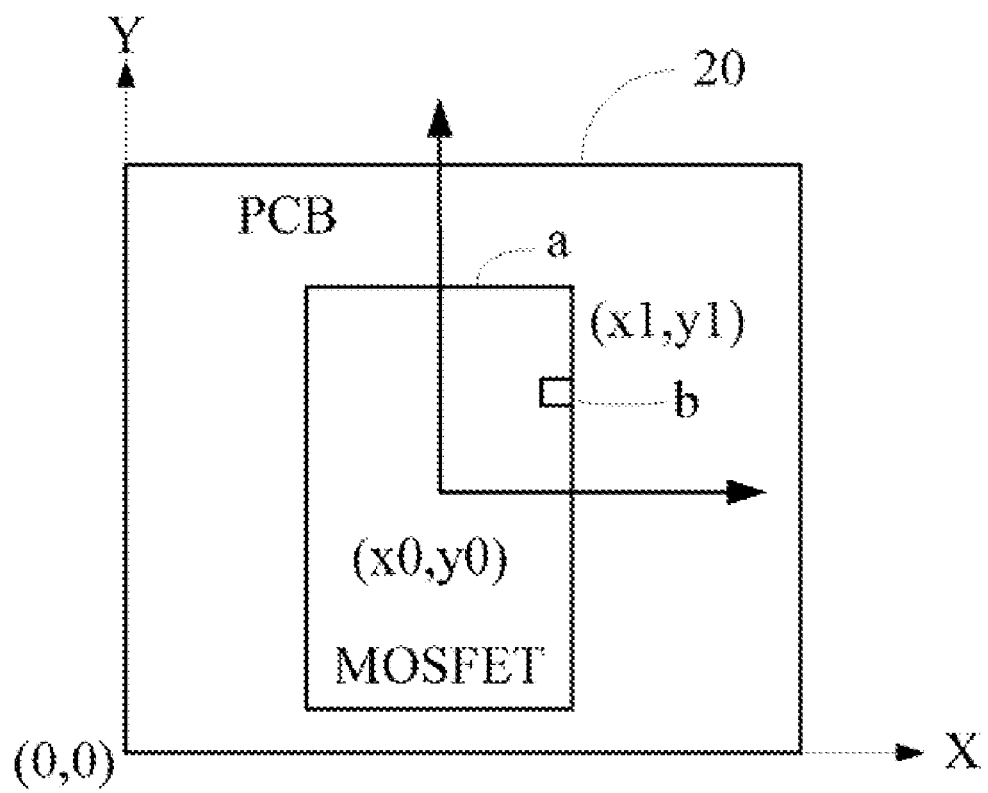
FIG. 6 is a schematic diagram illustrating one embodiment of calculating coordinates of a source pin of a metallic oxide semiconductor field effect transistor (MOSFET) in the PCB.

The computer 1 includes a processor 102 and a storage system 103. The processor 102 executes one or more computerized operations of the computer 1 and other applications, to provide the functions of the computer 1. The storage system 103 stores one or more programs, such as programs of an operating system, other applications of the computer 1, and various kinds of data. The storage system 103 stores coordinates of components on the PCB 20. In one embodiment, the coordinates are in an absolute coordinate system whose origin may represent the lower left corner of the PCB 20, as shown in FIG. 6. When a user inputs coordinates of a component on the GUI 101, the component is highlighted on the GUI 101.

The storage system 103 also stores layout standard of the PCB 20 and a layout report. The layout standard include a first standard range of a distance between the source pin of each MOSFET and a capacitor pin of each coupling capacitor, as well as a second standard range of a capacitance of each coupling capacitor. The layout report records an inspection result of the layout of the PCB 20.

Figure 3:
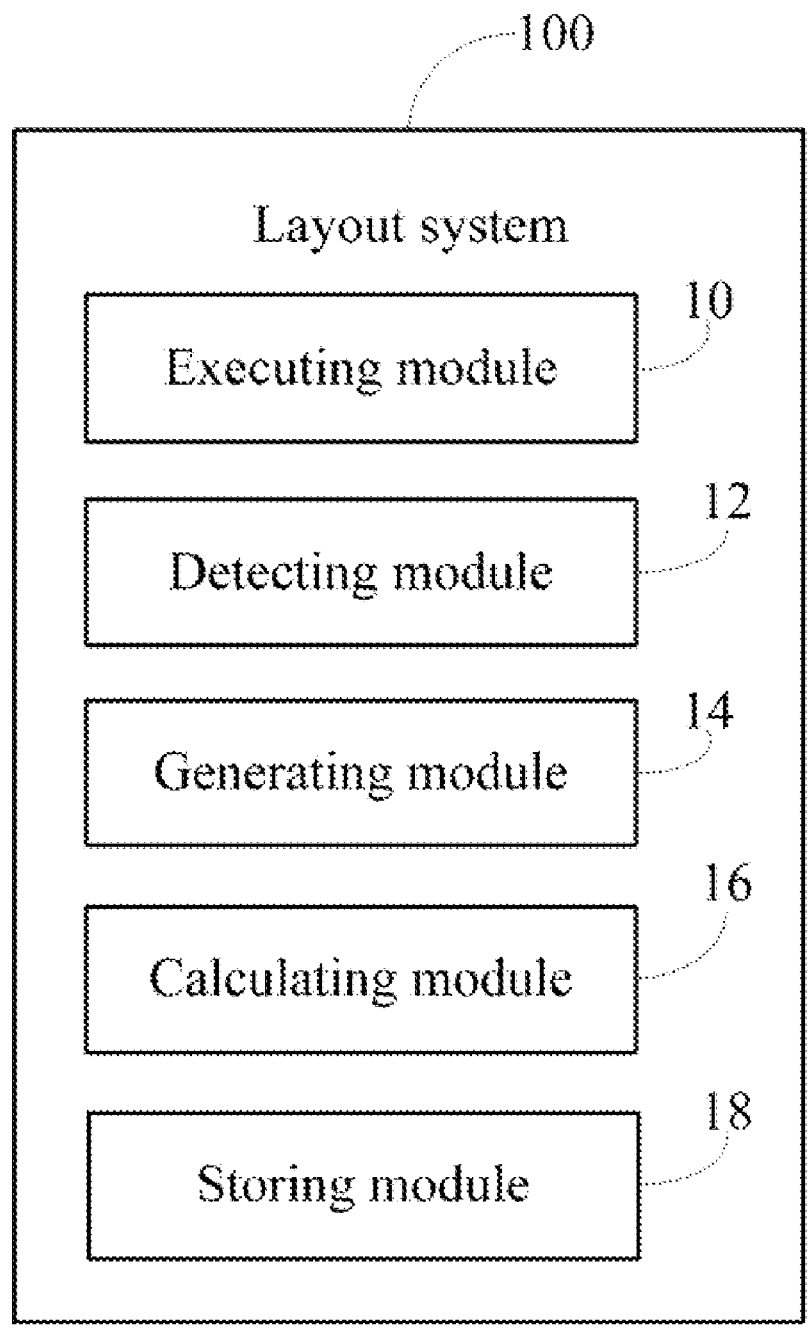
FIG. 3 is a block diagram of one embodiment of functional modules of the layout system in FIG. 1.

FIG. 3 is a block diagram of functional modules of the layout system 100 in FIG. 1. In one embodiment, the layout system 100 may include an executing module 10, a detecting module 12, a generating module 14, a calculating module 16, and a storing module 18. It may be understood that the processor 102 may be used to execute one or more computerized codes of the functional modules 10, 12, 14, 16, and 18. One or more computerized codes of the functional modules 10, 12, 14, 16, and 18 may be stored in the storage system 103. Details of these operations will be provided below.

The executing module 10 searches for all the high side pins of the PWM controller 22, then assigns serial numbers to the found high side pins. The executing module 10 then inspects each high side pin in turn to identify any components 23 connected to each high side pin. For example it searches for the high side pin number X, then X+1 etc, where X is a whole number. In one embodiment, an initial value of X is zero.

As each component 23 is identified by the module 10, the detecting module 12 checks if the identified component 23 is a MOSFET. If the identified component 23 is a MOSFET, the generating module 14 does the following.

The generating module 14 generates a first relative coordinate system of the component 23 identified as a MOSFET. In one embodiment, the origin of the first relative coordinate system is a center point of the MOSFET on the PCB 20. The generating module 14 records first relative coordinates of the source pin of the MOSFET in the first relative coordinate system.

The calculating module 16 calculates absolute coordinates of the source pin in the absolute coordinate system according to the first relative coordinates of the source pin and absolute coordinates of the center point of the MOSFET. As shown in FIG. 6, the absolute coordinates of the center point of the MOSFET are (x0, y0). The generating module 14 generates the first relative coordinate system whose origin is the center point (x0, y0). The relative coordinates of the source pin of the MOSFET are (x1, y1). The calculating module 16 calculates the absolute coordinates of the source pin being (x0+x1, y0+y1).

The executing module 10 searches for a coupling capacitor connected to the source pin of the MOSFET. Then the generating module 14 generates a second relative coordinate system. The origin of the second relative coordinate system is the center point of the found coupling capacitor. The generating module 14 records the second relative coordinates of a capacitor pin of the found coupling capacitor in the second relative coordinate system.

The calculating module 16 calculates absolute coordinates of the capacitor pin according to the second relative coordinates capacitor pin and the absolute coordinates of the coupling capacitor. The calculating module 16 calculates a linear distance between the source pin and the capacitor pin according to the absolute coordinates of the source pin and the absolute coordinates of the capacitor pin. The calculating module 16 also calculates a trace distance between the source pin and the capacitor pin according to the signal path between the MOSFET and the coupling capacitor. The storing module 18 stores the calculated linear distance and the trace distance.

The detecting module 12 detects if the linear distance and the trace distance accord with the layout standard. If the linear distance and the trace distance accord with the layout standard, the detecting module 12 detects if a capacitance of the coupling capacitor accords with the layout standard. If the capacitance of the coupling capacitor accords with the layout standard, the detecting module 12 detects if there is any coupling capacitor connected to the source pin that has not been inspected. The detecting module 12 generates corresponding detection results. In one embodiment, the detection results represent if the layout of the PCB 102PCB 20 is up to standard.

The executing module 10 records whether the layout of the PCB 20 is up to standards or not up to standards in the layout report.

Figure 4:
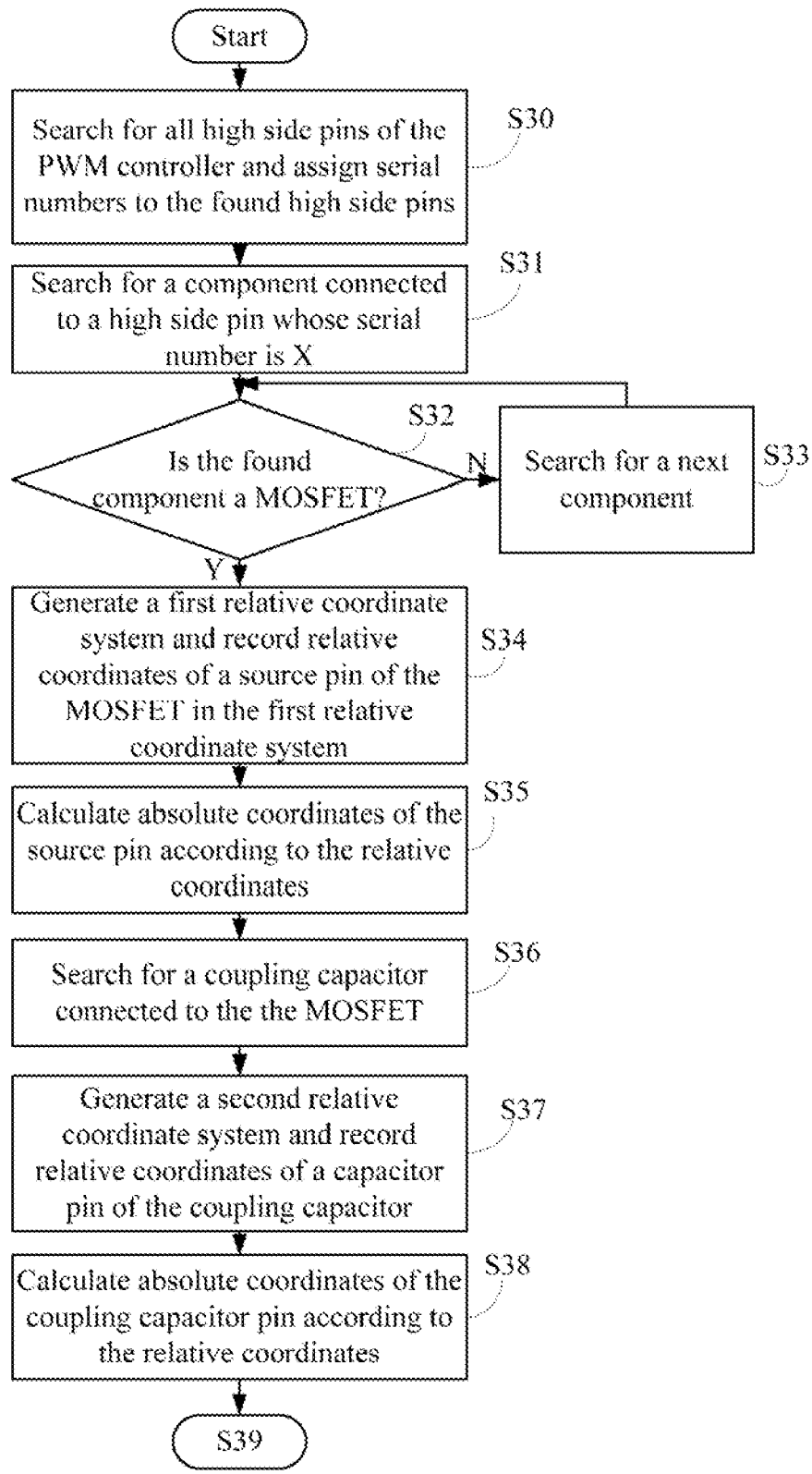
FIG. 4 and FIG. 5 are a flowchart of one embodiment of a method for inspecting layout of the PCB.
Figure 5:
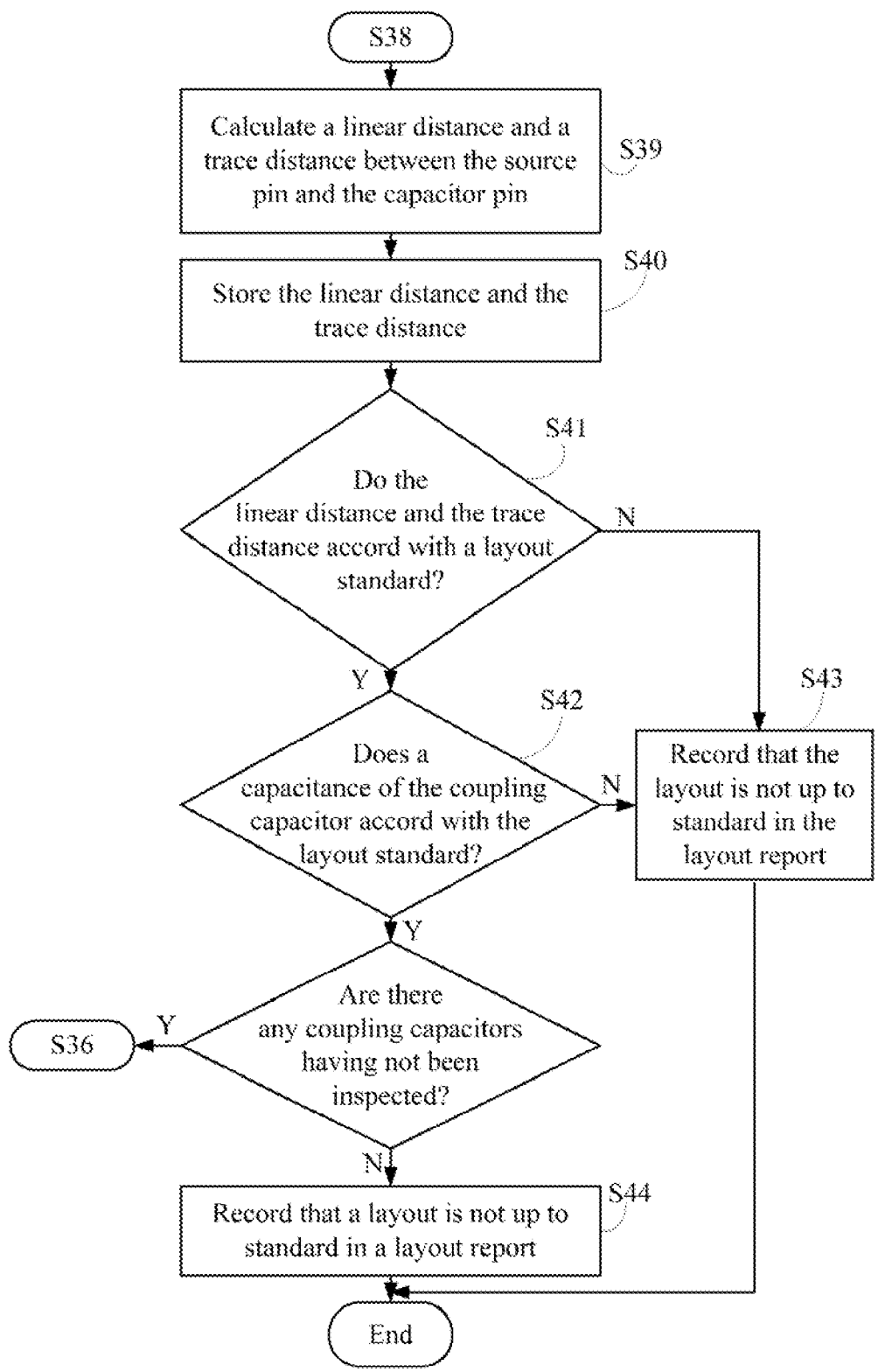

FIG. 4 is a flowchart of one embodiment of a method for inspecting layout of the PCB 20. Depending on the embodiment, additional blocks may be added, others removed, and the ordering of the blocks may be changed.

In block S30, the executing module 10 searches for all high side pins of the PWM controller 22, then assigns serial numbers to all the found high side pins.

In block S31, the executing module 10 searches for a component connected to a high side pin whose serial number is X. In one embodiment, an initial value of X is zero.

In block S32, the detecting module 12 checks if the found component is a MOSFET. If the found component is not the MOSFET, in block S33, the executing module 10 searches for a next component connected to the component. If the found component is the MOSFET, block S34 is implemented.

In block S34, the generating module 14 generates a first relative coordinate system and records first relative coordinates of the source pin of the MOSFET in the first relative coordinate system.

In block S35, the calculating module 16 calculates absolute coordinates of the source pin according to the first relative coordinates of the source pin and absolute coordinates of the center point of the MOSFET.

In block S36, the executing module 10 searches for a coupling capacitor connected to the MOSFET.

In block S37, the generating module 14 generates a second relative coordinate system whose origin is a center point of the coupling capacitor, and records a second relative coordinate of the capacitor pin of the coupling capacitor.

In block S38, the calculating module 16 calculates absolute coordinates of the capacitor pin according to the second relative coordinates of the capacitor pin and the absolute coordinates of the coupling capacitor.

In block S39, the calculating module 16 calculates a linear distance according to the second relative coordinates of the capacitor pin and the absolute coordinates of the coupling capacitor. The calculating module 16 calculates a trace distance between the source pin and the capacitor pin according to the signal path between the MOSFET and the coupling capacitor. In block S40, the storing module 18 stores the calculated linear distance and the trace distance.

In block S41, the detecting module 12 detects if the linear distance and the trace distance accord with the layout standard. If the linear distance and the trace distance accord with the layout standard, block S43 is implemented. If the linear distance or the trace distance does not accord with the layout standard, block S42 is implemented.

In block S42, the executing module 10 records that the layout of the PCB 20 is up to standard into the layout report.

In block S43, the detecting module 12 detects if a capacitance of the coupling capacitor accords with the layout standard. If the capacitance of the coupling capacitor accords with the layout standard, block S44 is implemented. If the capacitance of the coupling capacitor does not accord with the layout standard, block S42 is repeated.

In block S44, the detecting module 12 detects if there is a coupling capacitor connected to the source pin having not been inspected. If there is a coupling capacitor connected to the source pin having not been inspected, block S36 is repeated. If there is no coupling capacitor connected to the driver having not been inspected, block S45 is implemented.

In block S45, the executing module 10 records that the layout of the PCB 20 is not up to standard into the layout report.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A system for inspecting layout of a printed circuit board (PCB), the system comprising:
   a storage system to store a layout standard of the PCB; and
   at least one processor to execute one or more programs stored in the storage system, the one or more programs comprising:
   an executing module operable to search for a high side pin of a pulse width modulation (PWM) controller on the PCB, determine a metallic oxide semiconductor field effect transistor (MOSFET) connected to the high side pin on the PCB, and search for a coupling capacitor connected to the MOSFET;
   a calculating module operable to calculate a linear distance between a source pin of the MOSFET and a capacitor pin of the coupling capacitor, and calculate a trace distance between the source pin and the capacitor pin according to a signal path routing between the MOSFET and the coupling capacitor;
   a detecting module operable to detect if the linear distance and the trace distance accord with the layout standard stored in the storage system and if a capacitance of the coupling capacitor accords with the layout standard, and generate corresponding detection results; and
   the executing module further operable to record the detection results in a layout report.

2. The system of claim 1, wherein the one or more programs further comprises a generating module:
   the generating module operable to generate a first relative coordinate system whose origin is a center point of the MOSFET on the PCB, record first relative coordinates of the source pin in the first relative coordinate system, generate a second relative coordinate system whose origin is a center point of the coupling capacitor, and record second relative coordinates of the capacitor pin in the second relative coordinate system; and
   the calculating module further operable to calculate absolute coordinates of the source pin according to the first relative coordinates of the source pin, and calculate absolute coordinates of the capacitor pin according to the second relative coordinates of the capacitor pin.

3. The system of claim 1, wherein the executing module is further operable to determine that the layout is up to standard if the capacitance of each coupling capacitor accords with the layout standard, and determine that the layout is not up to standard if the capacitance of any coupling capacitor does not accord with the layout standard or any of the linear distance and trace distance does not accord with the layout standard.

4. A computer-implemented method being executed by a processor of a computer for inspecting layout of a printed circuit board (PCB), the method comprising:
(a) searching for a high side pin of a pulse width modulation (PWM) controller on the PCB;
(b) determining a metallic oxide semiconductor field effect transistor (MOSFET) connected to the high side pin on the PCB;
(c) searching for a coupling capacitor connected to the MOSFET;
(d) calculating a linear distance between a source pin of the MOSFET and a capacitor pin of the coupling capacitor;
(e) calculating a trace distance between the source pin and the capacitor pin according to a signal path routing between the MOSFET and the coupling capacitor;
(f) detecting if the linear distance and the trace distance accord with a layout standard of the PCB and if a capacitance of the coupling capacitor accords with the layout standard;
(g) repeating blocks (c) to (f) until all of the coupling capacitors connected to the MOSFET have been inspected; and
(h) generating corresponding detection results and recording the detection result in a layout report.

5. The method of claim 4, wherein block (d) comprises:
generating a first relative coordinate system whose origin is a center point of the MOSFET on the PCB, and recording first relative coordinates of the source pin in the first relative coordinate system;
calculating absolute coordinates of the source pin according to the first relative coordinates of the source pin;
generating a second relative coordinate system whose origin is a center point of the coupling capacitor, and recording second relative coordinates of the capacitor pin in the second relative coordinate system;
calculating absolute coordinates of the capacitor pin according to the second relative coordinates of the capacitor pin; and
calculating the linear distance according to the absolute coordinates of the source pin and the absolute coordinates of the capacitor pin.

6. The method of claim 4, further comprising:
determining that the layout is up to standard if the capacitance of each coupling capacitor connected to the MOSFET accords with the layout standard; and
determining that the layout is not up to standard if the capacitance of any coupling capacitor does not accord with the layout standard or any of the linear distance and trace distance does not accord with the layout standard.

7. A non-transitory computer-readable medium having stored therein instructions that, when executed by a computer, cause the computer to perform a method for inspecting layout of a printed circuit board (PCB) comprising:
(a) searching for a high side pin of a pulse width modulation (PWM) controller on the PCB;
(b) determining a metallic oxide semiconductor field effect transistor (MOSFET) connected to the high side pin;
(c) searching for a coupling capacitor connected to the MOSFET;
(d) calculating a linear distance between a source pin of the MOSFET and a capacitor pin of the coupling capacitor;
(e) calculating a trace distance between the source pin and the capacitor pin according to a signal path routing between the MOSFET and the coupling capacitor;
(f) detecting if the linear distance and the trace distance accord with a layout standard of the PCB and if a capacitance of the coupling capacitor accords with the layout standard;
(g) repeating blocks (c) to (f) until all of the coupling capacitors connected to the MOSFET have been inspected; and
(h) generating corresponding detection results and recording the detection result in a layout report.

8. The non-transitory computer-readable medium of claim 7, before block (d) further comprising:
generating a first relative coordinate system whose origin is a center point of the MOSFET, and recording first relative coordinates of the source pin in the first relative coordinate system;
calculating absolute coordinates of the source pin according to the first relative coordinates of the source pin;
generating a second relative coordinate system whose origin is a center point of the coupling capacitor, and recording second relative coordinates of the capacitor pin in the second relative coordinate system;
calculating absolute coordinates of the capacitor pin according to the second relative coordinates of the capacitor pin; and
calculating the linear distance according to the absolute coordinates of the source pin and the absolute coordinates of the capacitor pin.

9. The non-transitory computer-readable medium of claim 7, further comprising:
determining that the layout is up to standard if the capacitance of each coupling capacitor connected to the MOSFET accords with the layout standard; and
determining that the layout is not up to standard if the capacitance of any coupling capacitor does not accord with the layout standard or any of the linear distance and trace distance does not accord with the layout standard.

* * * * *